United States Patent
Kawamura et al.

(10) Patent No.: US 7,015,543 B2
(45) Date of Patent: Mar. 21, 2006

(54) TRENCH-GATE SEMICONDUCTOR DEVICE AND FABRICATION METHOD THEREOF

(75) Inventors: Takahiro Kawamura, Kanagawa (JP); Ryosuke Nakamura, Kanagawa (JP)

(73) Assignee: Sony Corporation, (JP)

( * ) Notice: Subject to any disclaimer, the term of this patent is extended or adjusted under 35 U.S.C. 154(b) by 0 days.

(21) Appl. No.: 10/363,543

(22) PCT Filed: Jul. 4, 2002

(86) PCT No.: PCT/JP02/06812

§ 371 (c)(1),
(2), (4) Date: Mar. 5, 2003

(87) PCT Pub. No.: WO03/009391

PCT Pub. Date: Jan. 30, 2003

(65) Prior Publication Data

US 2003/0170955 A1    Sep. 11, 2003

(30) Foreign Application Priority Data

Jul. 10, 2001    (JP) .............................. 2001-208951

(51) Int. Cl.
    *H01L 29/76*    (2006.01)
    *H01L 21/336*   (2006.01)
(52) U.S. Cl. ...................... 257/327; 257/330; 257/332; 438/259; 438/270
(58) Field of Classification Search ................ 438/268, 438/270, 259, 273, 589; 257/327, 330, 332
    See application file for complete search history.

(56) References Cited

U.S. PATENT DOCUMENTS

| | | | |
|---|---|---|---|
| 5,408,116 A | | 4/1995 | Tanaka et al. |
| 6,117,734 A | * | 9/2000 | Nakamura .................. 438/268 |
| 6,482,701 B1 | * | 11/2002 | Ishikawa et al. ............ 438/270 |
| 6,693,011 B1 | * | 2/2004 | Wahl et al. .................. 438/270 |
| 2002/0195655 A1 | * | 12/2002 | Hshieh et al. .............. 257/330 |

FOREIGN PATENT DOCUMENTS

EP    0 499 418 A1    8/1992

(Continued)

OTHER PUBLICATIONS

Preliminary Examination Report dated Jul. 4, 2002.

(Continued)

*Primary Examiner*—Hsien-Ming Lee
(74) *Attorney, Agent, or Firm*—Rader, Fishman & Grauer PLLC; Ronald P. Kananen

(57) ABSTRACT

A trench gate semiconductor device, which can improve the difficulty of channel inversion to thereby improve the switching characteristics as maintaining the effect of suppression of short-channel effects and the high dielectric voltage characteristic between the gate and the drain. The trench gate semiconductor device includes a gate electrode (18) buried in a trench (14) formed in an Si substrate (12) through a gate insulating film (16), and a source/drain diffusion layer (20) formed in a surface region of the Si substrate (12) on the opposite sides of the trench (14). In this trench gate semiconductor device, the corner portions (14a) and (14b) formed by the side walls and the bottom wall of the trench (14) are rounded so as to form concave surfaces concaved inward of the trench (14).

2 Claims, 5 Drawing Sheets

FOREIGN PATENT DOCUMENTS

| | | |
|---|---|---|
| EP | 0 499 418 A2 | 8/1992 |
| EP | 0 666 590 A1 | 8/1995 |
| EP | 0 666 590 A2 | 8/1995 |
| JP | 58-202560 A1 | 11/1983 |
| JP | 2-110973 A1 | 4/1990 |
| JP | 3-219677 A1 | 9/1991 |
| JP | 06-061487 A1 | 3/1994 |

OTHER PUBLICATIONS

International Search Report dated Sep. 17, 2002.

* cited by examiner

TRENCH-GATE SEMICONDUCTOR DEVICE AND FABRICATION METHOD THEREOF

TECHNICAL FIELD

The present invention relates to a trench gate semiconductor device and a fabrication method therefor and, more particularly, to a trench gate semiconductor device which can improve transistor characteristics by the addition of a simple configuration and also to a fabrication method for such a trench gate semiconductor device.

BACKGROUND ART

As a semiconductor device for processing large amounts of information at high speeds, an Emb (Embedded) DRAM configured by embedding a high-capacity DRAM and a high-speed logic integrated circuit in one chip is in practical use.

However, in response to a demand for annually accelerating the miniaturization of a semiconductor device, the following various problems become obvious in the Emb DRAM.

(1) The substrate concentration of a semiconductor substrate forming the semiconductor device is being increased, so as to maintain a high performance of a transistor against the shrinkage of a DRAM memory cell. As a result, a concentration change at a junction portion in a DRAM section is becoming steeper.

Accordingly, an electric field applied to the junction portion is becoming stronger, causing a difficulty in suppressing a leak from the junction portion to the order of ppm in a megabit-class DRAM. As a result, the data-retention characteristics (generally referred to as Tail characteristics) of the DRAM conventionally controllable with a margin are difficult to maintain, similarly to the conventional DRAM.

In the current situation, no effective measures against the above problem are found except increasing the capacitance of a capacitor with changes in generation.

(2) With the shrinkage of the DRAM cell, the contact area between a diffusion layer leading contact (leading electrode) and a diffusion layer becomes narrower to cause an increase in contact resistance at a rate of about 200% every generation. It is expected that the contact resistance will become several kiloohms in the next 0.1 $\mu$m generation, which resistance may be comparable to the on-state resistance of a memory cell transistor.

When the contact resistance becomes large, variations in the contact resistance have a great effect not only on the operation of the memory cell transistor, but also on the operation of the DRAM, especially the high-speed operation of the DRAM. Therefore, a higher positioning accuracy between the contact and the diffusion layer is required in a manufacturing process for the DRAM. Particularly, in the DRAM required to perform a high-speed operation, the improvement in the positioning accuracy is a matter of concern from the viewpoint of ensuring performance.

(3) Further, with the shrinkage of the DRAM cell, the interlayer insulation distance between a word line and a diffusion layer leading contact formed aside the word line is becoming smaller every year. For example, to ensure a dielectric voltage between the word line and the diffusion layer leading contact, the interlayer insulation distance between the word line and the diffusion layer leading contact is said to be 20 to 30 nm as a limited distance. However, if the trend toward shrinkage in the area of the DRAM cell continues as it is, the interlayer insulation distance between the word line and the diffusion layer leading contact will become less than the limited distance of 20 to 30 nm in the next 0.1 $\mu$m generation.

(4) Conventionally, a WSi/doped polysilicon polycide structure is adopted as the word line in the DRAM to relieve the problem of a signal delay. However, the aspect ratio of the word line has been increased with the recent miniaturization of the DRAM, and it has been difficult to make a sufficiently low resistance in a wiring structure of the word line for the purpose of suppressing the signal delay on the word line. Particularly, in the Emb DRAM required to perform a high-speed operation, this signal delay on the word line is a serious problem affecting the access time to the DRAM.

To cope with this problem, wiring having a salicide structure is in practical use for a decrease in resistance of a gate electrode (word line).

However, if a salicide structure is applied to the gate electrode (word line) of a DRAM cell, offset $SiO_2$ cannot be used to cause a hindrance to the shrinkage of the DRAM cell. Further, to maintain the data retention characteristics, a process for preventing the formation of salicide in the diffusion layer of the DRAM is required. Accordingly, the use of the salicide structure for the gate electrode is difficult at present.

(5) Further, with the shrinkage of the DRAM, it is essential to form an opening with no margin in forming a memory node contact in the DRAM. Moreover, the distance between the contact opening and the word line is near a limited distance corresponding to a dielectric voltage, as in the case of the diffusion layer contact.

As a result, the contact diameter is reduced and a technique for efficiently suppressing an increase in resistance with the small contact diameter is therefore required.

(6) On the other hand, the improvement in performance of a transistor in a logic section is also remarkable. In particular, a $P^+$ gate electrode doped with boron ions by ion implantation to suppress an off-state leak in a P-channel transistor has been generally used.

In activating the $P^+$ gate electrode by heat treatment, there arises a problem of so-called "punch-through" in which the boron ions as impurities are diffused into the substrate. As a result, there are the serious problems of variations in characteristics of the P-channel transistor, depletion of the gate electrode, and degradation in gate dielectric performance.

Further, doped polysilicon widely used for the diffusion layer contact in the DRAM is a material absolutely required to be activated by heat treatment, and attention must be paid to matching in mixed mounting.

In the next 0.1 $\mu$m generation, it will be necessary to further reduce the thickness of a gate oxide film, and the techniques allowable in the present 0.18 $\mu$m generation may become inapplicable.

Accordingly, it is expected that a drastic improvement in the structure itself of the Emb DRAM will be necessary to maintain the trend toward the improvement of a chip's performance.

As an element structure capable of solving the six abovementioned problems expected to become obvious in the next 0.1 $\mu$m generation Emb DRAM and also capable of maintaining the trend toward the improvement of a chip's performance, there has been proposed a DRAM cell using a trench gate MOS transistor, or trench access transistor (TAT) having such a structure that the word line in the DRAM section is buried in a "trench" formed in a substrate.

A semiconductor device including a conventional trench gate MOS transistor (MOSFET) will now be described with reference to FIG. 5. The semiconductor device shown is an Emb DRAM having a DRAM memory section and a logic section in combination, wherein the DRAM memory section is configured by a TAT DRAM cell. FIG. 5 is a sectional view showing the configuration of a transistor section in the TAT DRAM cell. The logic section in the semiconductor device is not shown in FIG. 5, and a description therefor will be omitted herein, because it is not directly pertinent to the present invention.

The transistor section 10 in the TAT DRAM cell is an N-channel transistor, which includes a gate electrode 18 buried through a gate insulating film 16 in a trench 14 formed in a semiconductor substrate, e.g., Si substrate 12, a diffusion layer 20 formed in a surface region of the substrate on the opposite sides of the trench 14, and a diffusion layer leading electrode 22 connected to the diffusion layer 20.

The configuration of the transistor section 10 in the TAT DRAM cell will be further described in detail with reference to FIG. 5.

As shown in FIG. 5, isolation regions 24, each having a depth of about 0.1 to 0.2 $\mu$m, are formed in the Si substrate 12 by STI (Shallow Trench Isolation), for example. The trenches 14, each having a depth of about 50 to 100 nm, are formed in the Si substrate 12 and the isolation regions 24. The word line (gate electrode) 18 is formed in each trench 14 through the gate insulating film 16.

A P-well 26 is provided in a region of the Si substrate 12 between the adjacent isolation regions 24, i.e., in a transistor forming region, and a channel diffusion layer 28 having a high concentration is formed in a region of the Si substrate 12 between the P-well 26 and each trench 14.

In contrast, the concentration in a region of the semiconductor substrate on the opposite sides of each trench 14 and in a surface region of the semiconductor substrate is near the substrate concentration, which is an extremely low concentration.

The upper surface of the word line (gate electrode) 18 is lower in level than the surface of the Si substrate 12 near the upper portion of each trench 14 by 30 to 50 nm, preferably 40 to 50 nm, so as to ensure a dielectric voltage between the word line 18 and the diffusion layer leading electrode 22.

In FIG. 5, reference numeral 18a denotes a tungsten/tungsten-nitride layer or cobalt/cobalt-silicide layer.

Further, the source/drain diffusion layer 20 is formed in the surface region of the semiconductor substrate near the upper portion of each trench 14.

It is preferable to relieve a field strength to the Si substrate 12, and the concentration in the diffusion layer 20 and in a junction portion of the semiconductor substrate region to the diffusion layer 20 is therefore set to a low concentration, thereby forming a junction at a low field strength.

The region of the Si substrate 12 below the diffusion layer 20 is doped with almost no ions, so that the concentration in this region is extremely low. Accordingly, the N-P junction in this structure is an ultragraded junction. The ultragraded junction relieves an electric field in applying a reverse bias, thereby allowing suppression of a junction leak about two orders of magnitude larger than usual, which leak occurs at defective bits on the order of ppm in a megabit-class DRAM. The data retention characteristics for such defective bits dominate the chip performance of the DRAM, and the technique for suppressing the junction leak will become important in maintaining the data retention characteristics for the next-generation DRAM.

As mentioned above, the gate electrode 18 is buried in the Si substrate 12 through the gate insulating film 16, and the diffusion layer 20 is formed in the surface region of the Si substrate 12. Accordingly, the channel is formed so as to pass through the region of the substrate below the bottom of each trench 14 within which the gate electrode 18 is formed.

Thus, the transistor section in the DRAM constitutes a trench gate MOSFET having such a structure that the channel is formed so as to extend around each trench 14, so that a long effective channel length can be ensured to thereby stabilize the transistor characteristics of a DRAM cell used by applying a back bias to exhibit remarkable short-channel effects.

A CVD $SiO_2$ film 32 having a thickness of 20 to 40 nm is formed on the Si substrate 12 inclusive of the diffusion layer 20 except the inside of each trench 14. Further, an $SiO_2$ film 34 as a sidewall protective wall for each trench 14 is formed on an upper portion of the sidewall of each trench 14 so as to extend to the upper surface of the $SiO_2$ film 32. Further, an SiN cap layer 36 is formed on the $SiO_2$ film 32, the $SiO_2$ film 34, and the gate electrode 18.

An interlayer insulating film 38 is formed on the SiN cap layer 36, and the upper surface of the interlayer insulating film 38 is planarized.

The diffusion layer leading electrode 22 is formed like a plug so as to extend through the interlayer insulating film 38, the SiN cap layer 36, and the CVD $SiO_2$ film 32 to the diffusion layer 20. The leading electrode 22 is formed of phosphorous-doped polysilicon.

The leading electrodes 22 are connected to a capacitor and a bit line (both not shown) according to design.

In such a trench gate MOSFET as mentioned above, the steeper the slope of a subthreshold current with respect to a gate voltage applied, the better the switching characteristics. In other words, as an S parameter (Swing) becomes smaller to result in a steeper slope of the subthreshold current in a MOSFET, the switching characteristics become better.

The S parameter is defined as a parameter when an output end and an input end of a MOSFET or the like as a subject of measurement are terminated at a characteristic impedance of 50 $\Omega$.

The miniaturization of a MOSFET must be achieved not only by merely reducing the size, but also as suppressing any undesirable phenomena, such as short-channel effects and punch-through, which become remarkable in association with a reduction in size of a gate electrode.

To suppress these phenomena, various improvements have been made in such a trench gate MOSFET as shown in FIG. 5. In the trench gate MOSFET, the channel is formed around the trench 14 to thereby ensure a gate length along the depth of the trench 14, so that a high dielectric voltage between the gate and the drain can be designed.

However, in the conventional trench gate MOSFET, as mentioned above, the channel inversion is difficult at right-angled corner portions formed by the side walls and the bottom wall of the trench 14 at its bottom portion, causing a problem that the transistor characteristics, especially the switching characteristics, do not reach an expected level.

In this case, the S parameter shows an extremely high value near 128 [mV], for example, and the current drive capability Ids shows an extremely low value near $1.5 \times 10^{-6}$, for example.

Accordingly, it is an object of the present invention to provide a trench gate semiconductor device which can improve the difficulty of channel inversion to thereby improve the switching characteristics as maintaining the effect of suppression of short-channel effects and the high dielectric voltage characteristic between the gate and the drain, both characteristics being the merits of a trench gate MOSFET. It is another object of the present invention to provide a fabrication method for such a trench gate semiconductor device.

DISCLOSURE OF INVENTION

The present inventor has examined the cause of the degradation in the S parameter and the current drive capability Ids to pay attention to the following points.

In the conventional trench gate MOSFET, the corner portions formed by the side walls and the bottom wall of the trench 14 at its bottom portion are substantially right-angled, as shown in FIG. 5. In such a case that the corner portions are right-angled, the gate insulating film 16 is thick at the corner portions. Further, when the substrate concentration is high, the degradation in transistor characteristics becomes more remarkable.

The present inventor has inferred that when the corner portions formed by the side walls and the bottom wall of the trench at its bottom portion are nearly right-angled, an electric field applied from the gate electrode to the channel is dispersed and the inversion of the number of carriers in the channel becomes difficult to cause a result that the depletion layer is not extended to deteriorate the S parameter (Swing).

Further, the present inventor has considered that the deterioration in the S parameter and the current drive capability Ids can be suppressed by approximating the shape of each corner portion at the bottom of the trench to a rounded shape.

The present inventor has verified these considerations by an experiment to reach the present invention.

According to the present invention, there is provided a trench gate semiconductor device including a gate electrode buried in a trench formed in a semiconductor substrate through a gate insulating film and a diffusion layer formed in a surface region of the semiconductor substrate on the opposite sides of the trench, wherein the corner portion between the side wall and the bottom wall of the trench is formed by a concave surface concaved inward of the trench.

As compared with the conventional, trench gate semiconductor device wherein the corner portion between the side wall and the bottom wall of the trench is substantially right-angled, the trench gate semiconductor device according to the present invention is characterized in that the corner portion is formed by a concave surface concaved inward of the trench. Accordingly, the gate electrode and the gate insulating film have a shape corresponding to the concave surface at the bottom portion of the trench, so that field concentration occurring in the gate insulating film, especially at the corner portion in the conventional structure, can be eliminated.

As a result, the S parameter can be reduced and the current drive capability can be increased, thereby obtaining good switching characteristics with a steep slope of subthreshold current.

The switching characteristics can be improved more with an increase in the radius of curvature of the concave surface at the bottom portion of the trench.

Preferably, when the width of the trench is in the range of 40 to 250 nm, the radius of curvature r of the concave surface is set in the range of 20 nm≦r≦the width of the trench/2. With this configuration, the radius of curvature r of the concave surface has a maximum value equal to ½ of the width of the trench. In the case that the radius of curvature r of the concave surface of each corner portion has this maximum value, the bottom of the trench becomes semicircular in cross section. In this case, the effect of suppression of the field concentration is maximized.

According to the present invention, there is provided a fabrication method for a trench gate semiconductor device including the steps of forming a trench in a semiconductor substrate so that the corner portion between the side wall and the bottom wall of the trench is formed by a concave surface concaved inward of the trench, burying a gate electrode in the trench through a gate insulating film, and forming a diffusion layer in a surface region of the semiconductor substrate on the opposite sides of the trench.

In the fabrication method for the trench gate semiconductor device according to the present invention, the corner portion between the side wall and the bottom wall of the trench at its bottom portion is formed by a concave surface. Accordingly, the gate electrode and the gate insulating film have a shape corresponding to the concave surface at the bottom portion of the trench, so that the field concentration occurring in the gate insulating film, especially at the corner portion in the conventional structure, can be eliminated to thereby greatly improve the S parameter and the current-drive capability.

BEST MODE FOR CARRYING OUT THE INVENTION

There now will be described in detail a specific preferred embodiment of the present invention with reference to the attached drawings. The configuration of a trench gate MOSFET in the preferred embodiment and a fabrication method therefor are merely illustrative for easy understanding of the present invention, and the present invention is not limited to the illustration described below.

Figure 1:
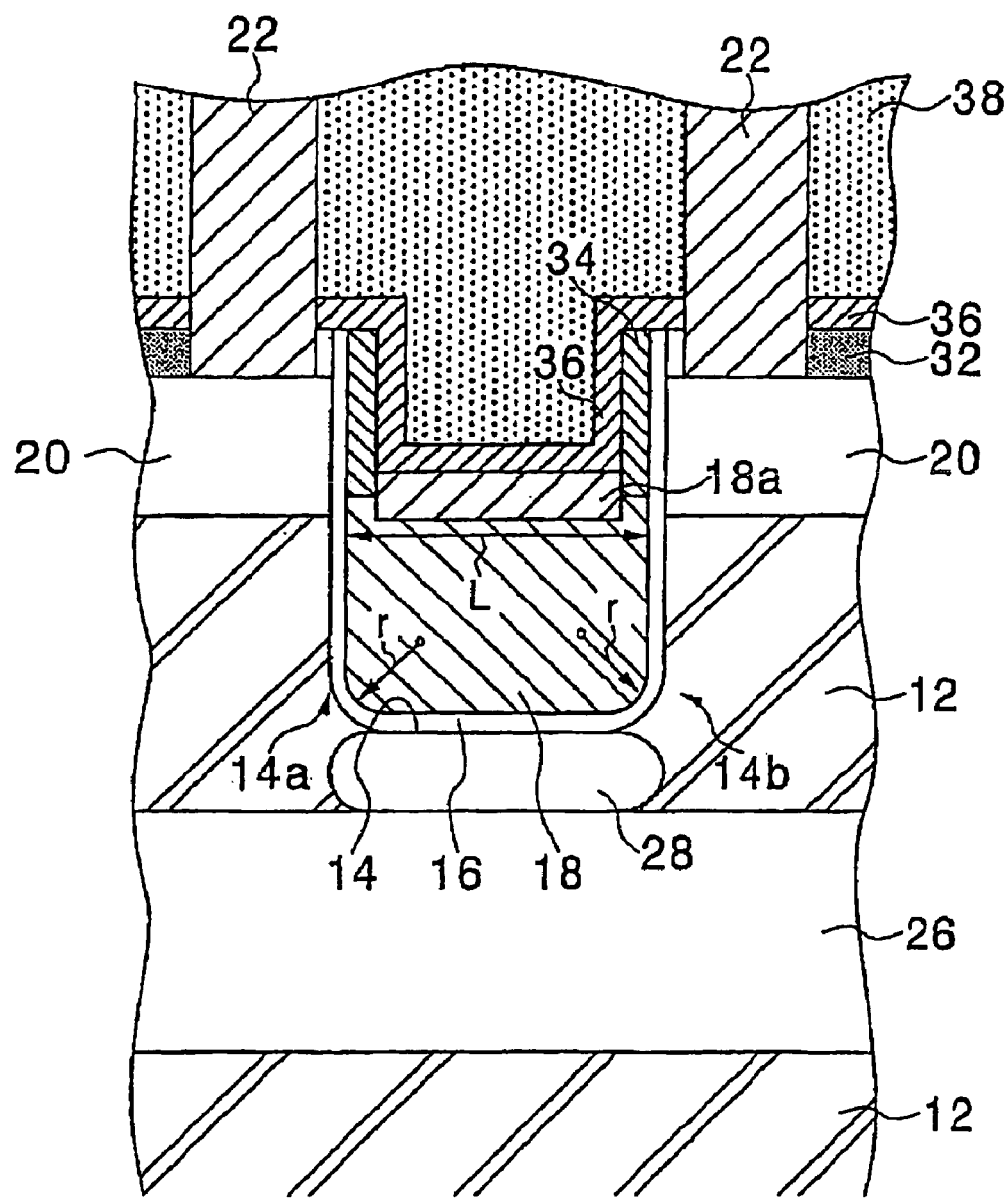
FIG. 1 is a sectional view of an essential part of a trench gate MOSFET according to a preferred embodiment of the present invention.

Configuration of a Trench Gate MOSFET:

The trench gate MOSFET illustrated herein is a preferred embodiment applying the trench gate semiconductor device according to the present invention. FIG. 1 is a sectional view of an essential part of the trench gate MOSFET according to this preferred embodiment.

Figure 5:
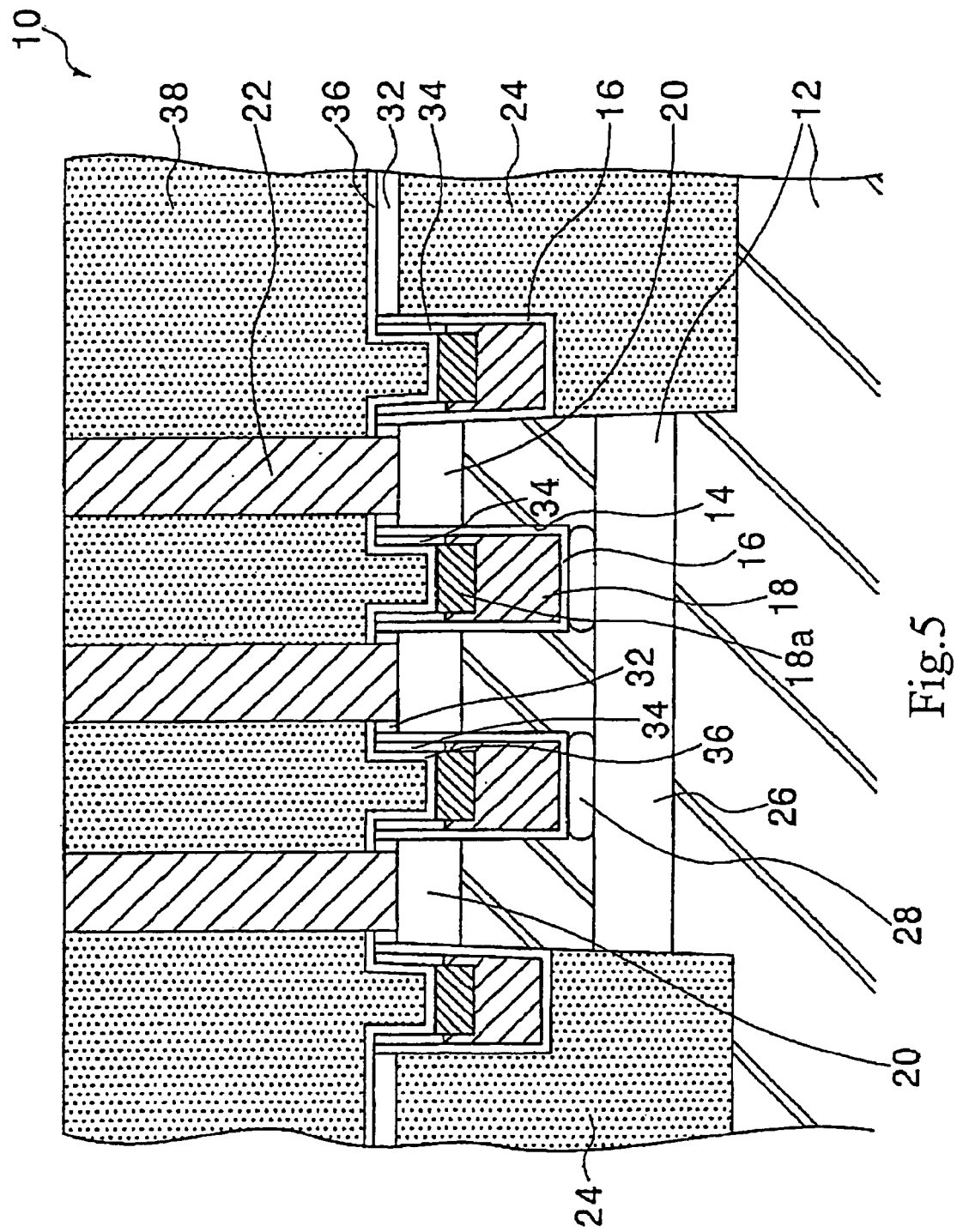
FIG. 5 is a sectional view showing the configuration of a transistor section in a conventional TAT DRAM cell.

The trench gate MOSFET according to this preferred embodiment has the same configuration as that of the conventional trench gate MOSFET of the transistor section 10 in the TAT DRAM cell shown in FIG. 5, except for the configuration of the bottom portion of the trench 14.

As shown in FIG. 1, the trench 14 is formed in Si substrate 12, and a gate electrode 18 is formed in the trench 14 through a gate insulating film 16.

A P-well 26 is provided in a transistor-forming region, and a channel diffusion layer 28 is formed in a region of the Si substrate 12 between the P-well 26 and the trench 14. A tungsten/tungsten-nitride layer or cobalt/cobalt-silicide layer 18a is formed at an upper portion of the gate electrode 18. A source/drain diffusion layer 20 is formed in a region of the semiconductor substrate on the opposite sides of the trench 14.

The region of the semiconductor substrate on the opposite sides of the trench 14 has a concentration substantially equal to the substrate concentration, which is an extremely low concentration in the range of $1.0 \times 10^{15}/cm^3$ to $5.0 \times 10^{16}/cm^3$, for example.

The concentration in the source/drain diffusion layer 20 is in the range of $5 \times 10^{16}/cm^3$ to $5 \times 10^{20}/cm^3$.

The gate insulating film 16 may be provided by a silicon-oxide film formed by thermal oxidation of silicon, and it has a thickness of about 1 to 5 nm, for example.

The bottom portion of the trench 14 is configured so that corner portions 14a and 14b formed by the side walls and the bottom wall of the trench 14 are rounded so as to form concave surfaces concaved inward of the trench 14. With this configuration, the gate electrode 18 and the gate insulating film 16 are formed in a concave shape corresponding to the shape of the bottom portion of the trench 14.

Each concave surface of the corner portions 14a and 14b has a radius of curvature r determined by the width L of the trench 14. For example, when the width L of the trench 14 is in the range of 40 to 250 nm, the radius of curvature r of each concave surface is set to an appropriate size of 20 nm or more.

Further, the radius of curvature r of each concave surface has a maximum size equal to ½ of the width L of the trench 14.

Figure 2:
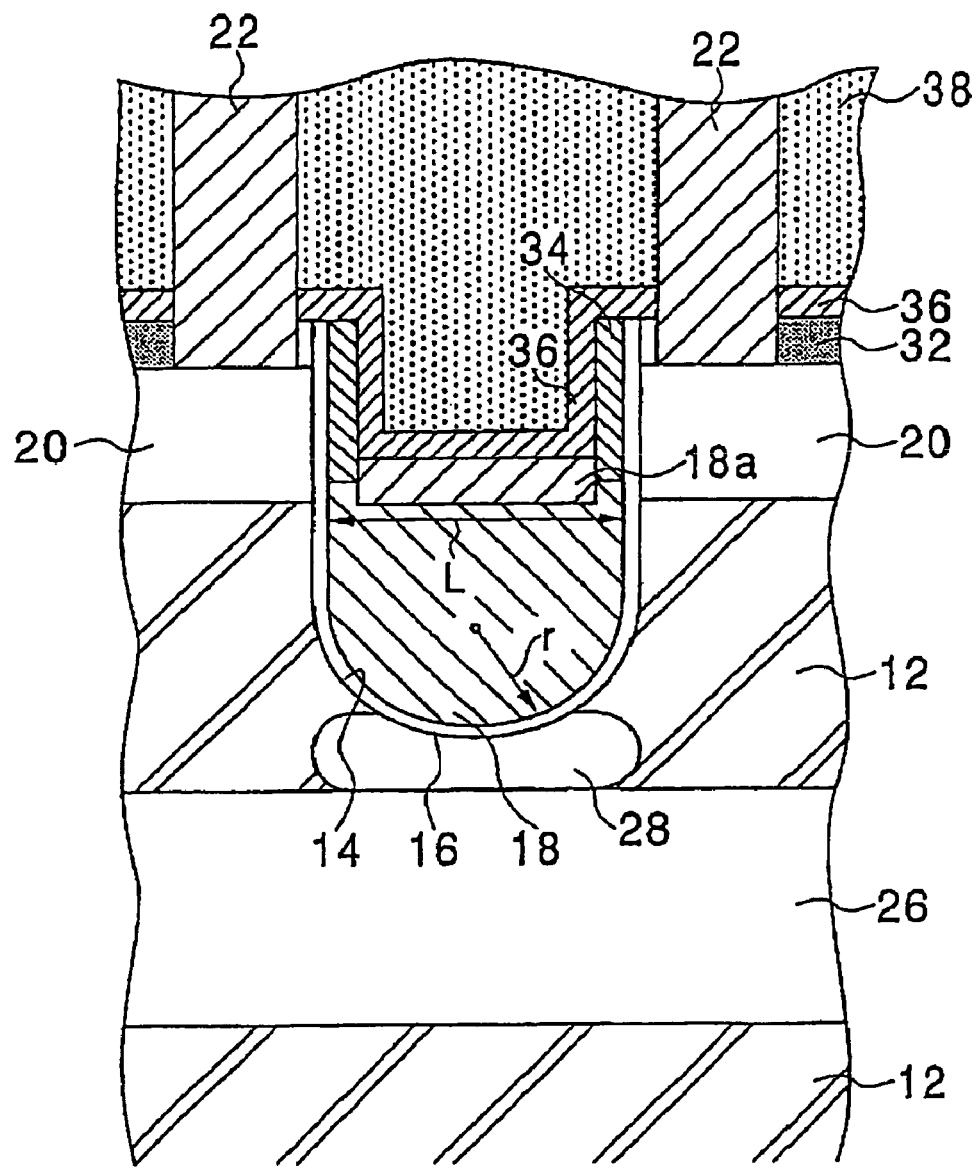
FIG. 2 is a sectional view of an essential part of a trench gate MOSFET according to a modification of the preferred embodiment.

FIG. 2 is a sectional view of an essential part of the trench gate MOSFET according to the modification of the preferred embodiment, in which the concave surface of the bottom portion of the trench is set to L/2.

As shown in FIG. 2, the radius of curvature r is set to L/2, so that the corner portions 14a and 14b shown in FIG. 1 are joined together to form a semicircular concave surface as a whole at the bottom of the trench 14. In this case, the effect of suppression of field concentration becomes maximum.

Consequently, the radius of curvature r formed by the side walls and the bottom wall of the trench 14 is preferably set in the range of 20 nm≦r≦L/2.

Fabrication Method for the Trench Gate MOSFET:

The fabrication method for the trench gate MOSFET according to this preferred embodiment has the same steps as the steps of the fabrication method for the trench gate MOSFET in the transistor section 10 shown in FIG. 5, except the step of forming the trench 14 by etching.

That is, the right-angled corner portions (see FIG. 5) at the bottom portion of the trench 14 are rounded so as to form concave surfaces by dry etching or the like in forming the trench 14 in the Si substrate 12. While only one of the corner portions may be rounded to form a concave surface, the effect of suppression of field concentration is reduced.

The subsequent steps are carried out as in the case of FIG. 5. That is, the gate electrode 18 is buried in the trench 14 through the gate insulating film 16, and the source/drain diffusion layer 20 is formed in the surface region of the Si substrate 12 on the opposite sides of the trench 14.

Thereafter, the tungsten/tungsten-nitride layer or cobalt/cobalt-silicide layer 18a and a SiO$_2$ film 34 are formed on the gate electrode 18, and a CVD SiO$_2$ film 32 is formed on the source/drain diffusion layer 20.

Thereafter, a SiN cap layer 36 and an interlayer insulating film 38 are sequentially formed on the tungsten/tungsten-nitride layer or cobalt/cobalt-silicide layer 18a, the SiO$_2$ film 34, and the SiO$_2$ film 32. Further, a diffusion layer leading electrode 22 is next formed so as to extend through the interlayer insulating film 38 and the SiN cap layer 36 to the source/drain diffusion layer 20.

The trench gate MOSFET fabricated by the above-mentioned method was examined by using device simulation. The primary structure used in the device simulation is as follows:

Width L of the trench 14 . . . 0.2 μm; and
Thickness of the gate insulating film 16 . . . 5 μm.

Figure 3:
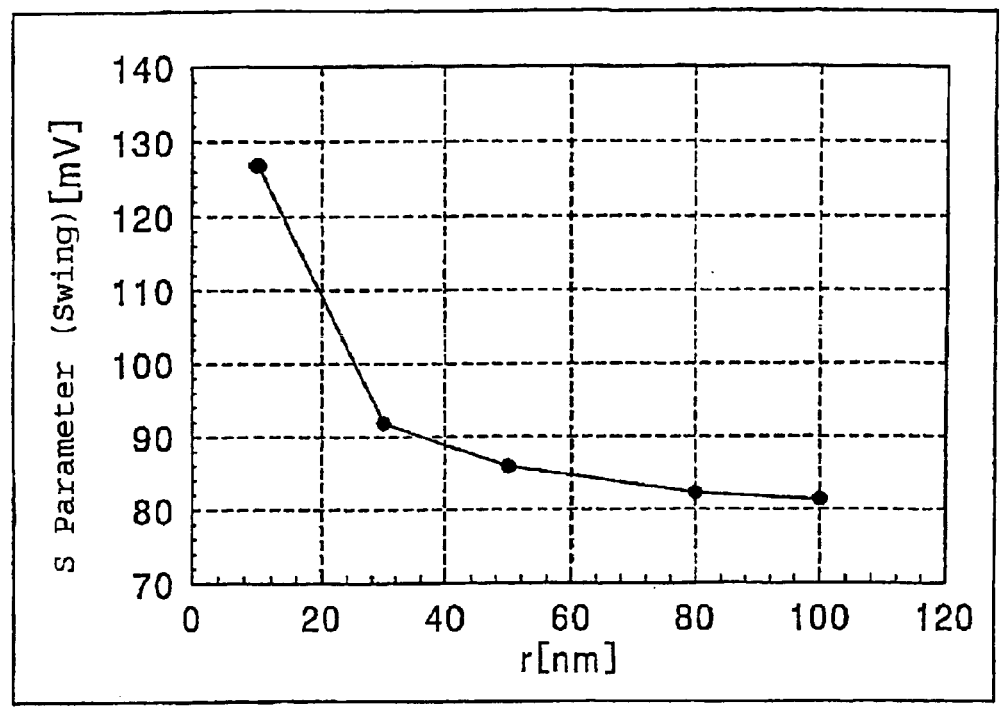
FIG. 3 is a graph showing the correlation between the radius of curvature at the bottom portion of a trench and the Swing in the trench gate MOSFET according to the preferred embodiment.
Figure 4:
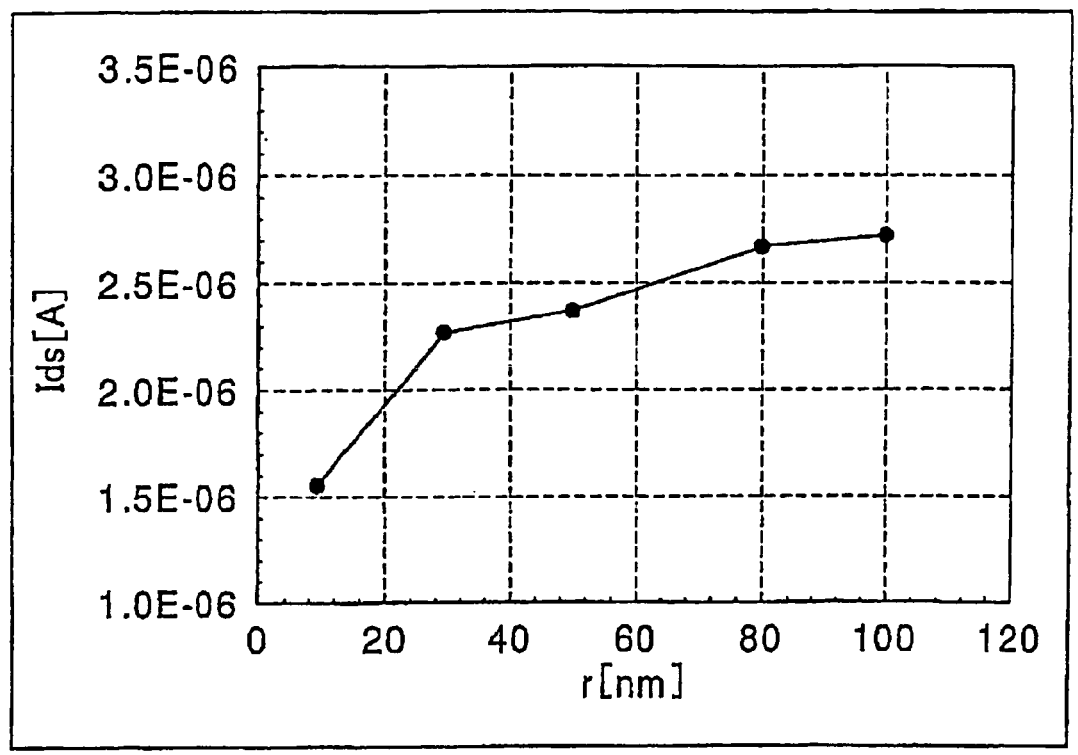
FIG. 4 is a graph showing the correlation between the radius of curvature at the bottom portion of the trench and the current drive capability in the trench gate MOSFET according to the preferred embodiment.

The results of examination by the device simulation are shown in FIGS. 3 and 4.

FIG. 3 is a graph showing the correlation between the radius of curvature r at the bottom portion of the trench 14 and the Swing (S parameter), and FIG. 4 is a graph showing the correlation between the radius of curvature r and the current drive capability Ids.

In the case that each corner portion at the bottom portion of the trench 14 in the trench gate MOSFET is nearly right-angled, that is, the radius of curvature r is near 0, the Swing shows an extremely poor characteristic, as high as 130 to 150 mV/dec, as shown in FIG. 3, and the current drive capability Ids shows an extremely poor characteristic, as low as $1.0 \times 10^{-6}$ to $1.5 \times 10^6$.

To the contrary, as the radius of curvature r is gradually increased from 20 nm to ½ of the width L of the trench 14, as in this preferred embodiment, the Swing is suddenly decreased in the initial stage and then gently decreased from the time the radius of curvature r exceeds about 25 nm.

In other words, when the radius of curvature r exceeds 20 nm, both the Swing and the current drive capability Ids start to show good values. With a further increase in the radius of curvature r, the Swing is decreased to near 82 mV/dec at the maximum, and the current drive capability Ids shows a value about twice that of the conventional configuration. Thus, both the Swing and the current drive capability Ids are improved to obtain very good switching characteristics.

The results shown in FIGS. 3 and 4 prove that a sufficiently large size for the radius of curvature r is effective in improving the switching characteristics. It is understood that in response to smaller sizes for the next-generation trench width as 0.1 μm and 0.07 μm, the shape of the bottom portion of the trench in the trench gate MOSFET must be approximated to a semicircular shape by setting the radius of curvature r to ½ of the trench width.

According to the present invention, as described above, the corner portion between the side wall and the bottom wall of the trench is formed by a concave surface concaved inward of the trench. Accordingly, it is possible to provide a trench gate semiconductor device, which can improve the difficulty of channel inversion to thereby improve the switching characteristics as maintaining the effect of suppression of short-channel effects and the high dielectric voltage characteristic between the gate and the drain, both characteristics being the merits of a trench gate MOSFET.

According to the method of the present invention, it is possible to easily fabricate a trench gate semiconductor device greatly improved in switching characteristics, as compared with the related art, by forming a trench in a semiconductor substrate so that the corner portion between the side wall and the bottom wall of the trench is formed by a concave surface concaved inward of the trench.

The invention claimed is:

1. A trench gate semiconductor device comprising a gate electrode buried in a trench formed in a semiconductor substrate through a gate insulating film, and a diffusion layer formed in a surface region of said semiconductor substrate on opposite sides of said trench, wherein:

a corner portion between a side wall and a bottom wall of said trench is formed by a concave surface concaved inward of said trench, said trench having a width of 250 nm or less: and when a width of said trench is in the range of 40 to 250 nm, a radius of curvature r of said concave surface is set in the range of: $20 \text{ nm} \leq r \leq$ the width of the trench/2.

2. A trench gate semiconductor device comprising a gate electrode buried in a trench formed in a semiconductor substrate through a gate insulating film, and a diffusion layer formed in a surface region of said semiconductor substrate on opposite sides of said trench, wherein:

a corner portion between a side wall and a bottom wall of said trench is formed by a concave surface concaved inward of said trench, wherein when a width of said trench is in the range of 40 to 250 nm, a radius of curvature r of said concave surface is set in the range of:

$20 \text{ nm} \leq r \leq$ the width of the trench/2.

* * * * *